(12) United States Patent
Bai

(10) Patent No.: US 8,811,532 B2
(45) Date of Patent: Aug. 19, 2014

(54) ARCHITECTURE AND THE TRAINING METHOD OF A PA DPD SYSTEM WITH SPACE MAPPING APPLIED IN THE PREDISTORTER

(75) Inventor: Chunlong Bai, Kanata (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 180 days.

(21) Appl. No.: 13/443,949

(22) Filed: Apr. 11, 2012

(65) Prior Publication Data

US 2013/0243122 A1    Sep. 19, 2013

Related U.S. Application Data

(60) Provisional application No. 61/611,847, filed on Mar. 16, 2012.

(51) Int. Cl.
H04L 25/49    (2006.01)

(52) U.S. Cl.
USPC .......... 375/297; 375/295; 375/296; 455/63.1; 455/67.13; 455/69; 455/114.3; 455/522; 330/149

(58) Field of Classification Search
CPC ..... H04L 27/368; H04L 25/49; H03F 1/3247; H03F 220/3227
USPC ........ 375/295, 296, 297; 455/63.1, 67.13, 69, 455/114.3, 522; 330/149
See application file for complete search history.

(56) References Cited

U.S. PATENT DOCUMENTS

| 6,141,390 | A  | 10/2000 | Cova |
| 6,320,463 | B1 | 11/2001 | Leva et al. |
| 6,600,516 | B1 | 7/2003  | Danielsons et al. |
| 6,947,711 | B1 | 9/2005  | Leyonhjelm |
| 7,330,517 | B2 | 2/2008  | Taler et al. |

(Continued)

FOREIGN PATENT DOCUMENTS

| EP | 1335489 A1 | 8/2003 |
| EP | 1517500 A1 | 3/2005 |

(Continued)

OTHER PUBLICATIONS

Non-Final Office Action for U.S. Appl. No. 13/333,391, mailed Aug. 20, 2013, 10 pages.

(Continued)

*Primary Examiner* — Leon Flores
(74) *Attorney, Agent, or Firm* — Withrow & Terranova, PLLC

(57) ABSTRACT

Systems and methods are disclosed for compensating for non-linearity of a power amplifier using space mapping based predistortion. In one embodiment, a transmitter includes a power amplifier that amplifies a power amplifier input signal, a predistorter that effects predistortion of the power amplifier input signal to compensate for a non-linear characteristic of the power amplifier using a space mapping based model of an inverse of the non-linear characteristic of the power amplifier, and an adaptation sub-system that adaptively configures the space mapping based model of the non-linear characteristic of the power amplifier. In one embodiment, the adaptation sub-system adaptively configures a space mapping based model of the non-linear characteristic of the power amplifier and adaptively configures the space mapping based model of the inverse of the non-linear characteristic of the power amplifier based on the space mapping based model of the non-linear characteristic of the power amplifier.

22 Claims, 10 Drawing Sheets

(56) References Cited

U.S. PATENT DOCUMENTS

| | | | |
|---|---|---|---|
| 7,469,491 | B2 | 12/2008 | McCallister et al. |
| 2003/0179831 | A1 | 9/2003 | Gupta et al. |
| 2005/0111575 | A1 | 5/2005 | Taler et al. |
| 2005/0163268 | A1 | 7/2005 | McCallister |
| 2005/0253745 | A1 | 11/2005 | Song et al. |
| 2007/0082617 | A1 | 4/2007 | McCallister |
| 2007/0087704 | A1 | 4/2007 | Gilberton |
| 2010/0329387 | A1 | 12/2010 | Watanabe |
| 2011/0095820 | A1 | 4/2011 | Hou et al. |
| 2013/0077713 | A1 | 3/2013 | Kim et al. |
| 2013/0243117 | A1* | 9/2013 | Jeckeln ............ 375/296 |

FOREIGN PATENT DOCUMENTS

| | | |
|---|---|---|
| EP | 2161841 A1 | 3/2010 |
| EP | 2175555 A1 | 4/2010 |
| WO | 0070750 A1 | 11/2000 |
| WO | 2013044238 A1 | 3/2013 |

OTHER PUBLICATIONS

Bandler, John W. et al, "Space Mapping: The State of the Art," IEEE Tranascations on Microwave Theory and Techniques, Jan. 2004, pp. 337-361, vol. 52, No. 1.
International Search Report and Written Opinion for PCT/IB2012/057569, mailed Jun. 27, 2013, 12 pages.
International Search Report and Written Opinion for PCT/IB2013/051754, mailed Jul. 11, 2013, 8 pages.
Notice of Allowance for U.S. Appl. No. 13/333,407, mailed Oct. 7, 2013, 9 pages.
Non-Final Office Action for U.S. Appl. No. 13/333,422, mailed Oct. 4, 2013, 7 pages.
Non-Final Office Action for U.S. Appl. No. 13/333,391, mailed Mar. 15, 2013, 10 pages.
International Search Report and Written Opinion for PCT/IB2012/057566, mailed Apr. 24, 2013, 13 pages.
International Search Report and Written Opinion for PCT/IB2012/057568, mailed May 13, 2013, 9 pages.
Non-Final Office Action for U.S. Appl. No. 13/333,407, mailed Jun. 4, 2013, 14 pages.
Ueda, M. et al., "Investigation on nonlinear distortion of acoustic devices for radio-frequency applications and its suppression," 2009 IEEE International Ultrasonics Symposium, Sep. 2009, pp. 876-879.
Tsutsumi J. et al., "Influence of linear and non-linear distortions in SAW/FBAR duplexers for 3rd generation mobile phone systems," Proceedings of the European Microwave Association, vol. 3, Jun. 2007, pp. 120-127.
Zhang, Q. J., "Artifical Neural Networks for RF and Microwave design: From theory to practice," Nov. 26, 2002, 55 pages, http://www.doe.carleton.ca/~qjz/ANN_Tutorial/Slides/ANN_Tutorial$_{13}$ Slides_11-26-02.pps.
Bandler, J. W. et al.,"Space mapping: the state of the art," IEEE Transactions Microwave on Theory and Techniques, vol. 52 No. 1, Jan. 2004, pp. 337-361.
Zhang, L. et al., "Efficient analytical formulation and sensitivity analysis of neuro-space mapping for nonlinear microwave device modeling," IEEE Transactions Microwave on Theory and Techniques, vol. 53 No. 9, Sep. 2005, pp. 2752-2767.
Zhang, L. et al., "Neuro-space mapping technique for nonlinear device modeling and large signal simulation," IEEE MTT-S Internatinoal Microwave Symposium Digest, Jun. 8-13, 2003, pp. 173-176.
Zhang, L. et al., "Neuro-space mapping technique for semiconductor device modeling," Optimization and Engineering, vol. 9 No. 4, 2008, pp. 393-405.
Bandler, J. W. et al., "Why space mapping works," Surrogate modelling and space mapping for engineering optimization, Lyngby, Denmark, Nov. 9-11, 2006, 41 pages.
Benvenuto, N. et al. "A neural network approach to data predistortion with memory in digital radio systems,"Proceedings of IEEE ICC, 1993, pp. 232-236.
Liu, T. et al. "Dynamic Behavioral Modeling of 3G Power Amplifiers Using Real-Valued Time-Delay Neural Networks," IEEE Transactions Microwave Theory and Techniques, vol. 52, No. 3, Mar. 2004, pp. 1025-1033.
Luongvyinh, D. et al. "Behavioral modeling of power amplifiers using fully recurrent neural networks," IEEE MTT-S International Microwave Symposium Digest, Jun. 12-17, 2005, pp. 1979-1982.
Ibnkahla, M. et al. "Neural networks for modeling nonlinear memoryless communication channels," IEEE Transactions on Communications, vol. 45, No. 7 Jul. 1997, pp. 768-771.
Mkadem, F. et al. "Physically Inspired Neural Network Model for RF Power Amplifier Behavioral Modeling and Digital Predistortion," IEEE Transactions Microwave on Theory and Techniques, vol. 59, No. 4, Apr. 2011, pp. 913-923.
Naskas, N. et al. "Adaptive baseband predistorter for radio frequency power amplifiers based on a multilayer perceptron," 9th International Conference on Electronics, Circuits and Systems, vol. 3, Dec. 10, 2002, pp. 1107-1110.
Olurotimi, O., "Recurrent neural network training with feedforward complexity," IEEE Transactions on Neural Networks, vol. 5, No. 2, Mar. 1994, pp. 185-197.
Pedro, J. et al. "A Comparative Overview of Microwave and Wireless Power-Amplifier Behavioral Modeling Approaches," IEEE Transactions Microwave on Theory and Techniques, vol. 58, No. 1, Apr. 2005, pp. 1150-1163.
Rawat, M. et al. "Adaptive Digital Predistortion of Wireless Power Amplifiers/Transmitters Using Dynamic Real-Valued Focused Time-Delay Line Neural Networks," IEEE Transactions Microwave Theory and Techniques, vol. 58, No. 1, Jan. 2010, pp. 95-104.
Zhang, Q. et al., "Artificial Neural Networks for RF and Microwave Design: From Theory to Practice," IEEE Transactions on Microwave Theory and Techniques, vol. 51, No. 4, Part 2, Apr. 2003, pp. 1339-1350.
Final Office Action for U.S. Appl. No. 13/333,391 mailed Feb. 4, 2014, 12 pages.
Non-final Office Action for U.S. Appl. No. 13/333,391 mailed May 6, 2014, 10 pages.
Final Office Action for U.S. Appl. No. 13/333,422 mailed Apr. 17, 2014, 9 pages.
Written Opinion of the International Preliminary Examining Authority for PCT/IB2012/057569 mailed Mar. 27, 2014, 6 pages.
International Preliminary Report on Patentability for PCT/IB2012/057569, mailed May 26, 2014, 9 pages.

\* cited by examiner

ARCHITECTURE AND THE TRAINING METHOD OF A PA DPD SYSTEM WITH SPACE MAPPING APPLIED IN THE PREDISTORTER

RELATED APPLICATIONS

This application claims the benefit of provisional patent application Ser. No. 61/611,847, filed Mar. 16, 2012, the disclosure of which is hereby incorporated herein by reference in its entirety.

FIELD OF THE DISCLOSURE

The present disclosure relates to digital predistortion to compensate for power amplifier non-linearity.

BACKGROUND

A radio system generally includes a transmitter that transmits information-carrying signals to a receiver. The transmitter includes a power amplifier that operates to amplify the signal to be transmitted to a power level that is sufficient to enable receipt of the signal by the receiver. Radio system transmitters are required to satisfy specifications for signal levels at frequencies other than the intended transmission frequencies. Some specifications are set by government regulatory bodies, while others are set by radio communications standards such as the Third Generation Partnership Project (3GPP) or IEEE 802.11. One specification, or requirement, is adjacent channel power, which is directly related to power amplifier linearity. Power amplifier linearity corresponds to an ability to reproduce an amplified version of the input signal. Also, power amplifiers are often described in terms of their efficiency, which is defined as some comparison between average transmit signal power and total average power required to generate the transmit signal power.

At a circuit level, power amplifier linearity may be achieved by biasing transistors in such a manner that the power amplifier operates in a linear fashion. However, doing so has a cost in terms of very low operating efficiency. As such, many modern power amplifiers are configured to operate at maximum efficiency, resulting in poor linearity, and use so-called "linearization" circuitry to correct non-linearity. Some exemplary power amplifiers that have high efficiency, but low linearity, are Class AB power amplifiers, Class B power amplifiers, Class C power amplifiers, Class F power amplifiers, Doherty power amplifiers, and Chireix power amplifiers.

Various linearization schemes have evolved having various trade-offs in terms of linearity, power dissipation, and versatility or robustness. These linearization schemes include, but are not limited to, analog predistortion, digital predistortion, feed-forward linearization, and feedback linearization. Predistortion linearization uses a predefined model of power amplifier non-linearity to generate an "opposite" nonlinear response that compensates for the non-linearity of the power amplifier. By amplifying the predistorted signal, the output of the power amplifier is as if the power amplifier were linear. The model utilized for predistortion needs to be designed to enable the predistortion to counteract the non-linear characteristics of the transistors forming the power amplifier. However, transistors are designed and fabricated using different technologies and therefore can exhibit drastically different characteristics.

Traditionally, there are two approaches to modeling the non-linear characteristic of the power amplifier, namely, a polynomial based approach and an artificial neural network model approach. The polynomial based approach includes the well-known Volterra series and its simplified versions, where the power series is the most basic form. The artificial neural network model approach uses artificial neural network modeling of the power amplifier. However, these approaches do not provide the desired performance in some situations. As such, there is a need for a high fidelity model for power amplifier predistortion.

SUMMARY

Systems and methods are disclosed for compensating for non-linearity of a power amplifier using space mapping based predistortion. In one embodiment, a transmitter includes a power amplifier that amplifies a power amplifier input signal to provide a power amplifier output signal, a predistorter that effects predistortion of the power amplifier input signal to compensate for a non-linear characteristic of the power amplifier using a space mapping based model of an inverse of the non-linear characteristic of the power amplifier, and an adaptation sub-system that adaptively configures the space mapping based model of the non-linear characteristic of the power amplifier. In one embodiment, the adaptation sub-system adaptively configures a space mapping based model of the non-linear characteristic of the power amplifier and adaptively configures the space mapping based model of the inverse of the non-linear characteristic of the power amplifier based on the space mapping based model of the non-linear characteristic of the power amplifier.

In one particular embodiment, the space mapping based model of the inverse of the non-linear characteristic of the power amplifier includes a coarse model of the inverse of the non-linear characteristic of the power amplifier and a space mapping that maps the coarse model of the inverse of the non-linear characteristic of the power amplifier into a fine model of the inverse of the non-linear characteristic of the power amplifier. Likewise, the space mapping model of the non-linear characteristic of the power amplifier includes a coarse model of the non-linear characteristic of the power amplifier and a space mapping that maps the coarse model of the non-linear characteristic of the power amplifier into a fine model of the non-linear characteristic of the power amplifier.

In one embodiment, the adaptation sub-system performs initial training of the predistorter by first training the coarse model of the non-linear characteristic of the power amplifier while the space mapping for the coarse model of the non-linear characteristic of the power amplifier and the predistorter are in by-pass mode. Second, the adaptation sub-system trains the space mapping for the coarse model of the non-linear characteristic of the power amplifier while the coarse model of the non-linear characteristic of the power amplifier is active and the predistorter is in by-pass mode. Third, the adaptation sub-system trains the coarse model of the inverse of the non-linear characteristic of the power amplifier while the coarse model of the non-linear characteristic of the power amplifier is active and the space mapping for the coarse model of the non-linear characteristic of the power amplifier and the space mapping for the coarse model of the inverse of the non-linear characteristic of the power amplifier are in by-pass mode. Fourth, the adaptation sub-system trains the space mapping for the coarse model of the inverse of the non-linear characteristic of the power amplifier while the coarse model of the inverse of the non-linear characteristic of the power amplifier, the coarse model of the non-linear characteristic of the power amplifier, and the space mapping for the coarse model of the non-linear characteristic of the power amplifier are active.

In another embodiment, the adaptation sub-system performs initial training of the predistorter by first training the coarse model of the non-linear characteristic of the power amplifier while the space mapping for the coarse model of the non-linear characteristic of the power amplifier and the predistorter are in by-pass mode. Second, the adaptation sub-system trains the coarse model of the inverse of the non-linear characteristic of the power amplifier while the coarse model of the non-linear characteristic of the power amplifier is active and the space mapping for the coarse model of the non-linear characteristic of the power amplifier and the space mapping for the coarse model of the inverse of the non-linear characteristic of the power amplifier are in by-pass mode. Third, the adaptation sub-system trains the space mapping for the coarse model of the non-linear characteristic of the power amplifier while the coarse model of the non-linear characteristic of the power amplifier is active and the predistorter is in by-pass mode. Fourth, the adaptation sub-system trains the space mapping for the coarse model of the inverse of the non-linear characteristic of the power amplifier while the coarse model of the inverse of the non-linear characteristic of the power amplifier, the coarse model of the non-linear characteristic of the power amplifier, and the space mapping for the coarse model of the non-linear characteristic of the power amplifier are active.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
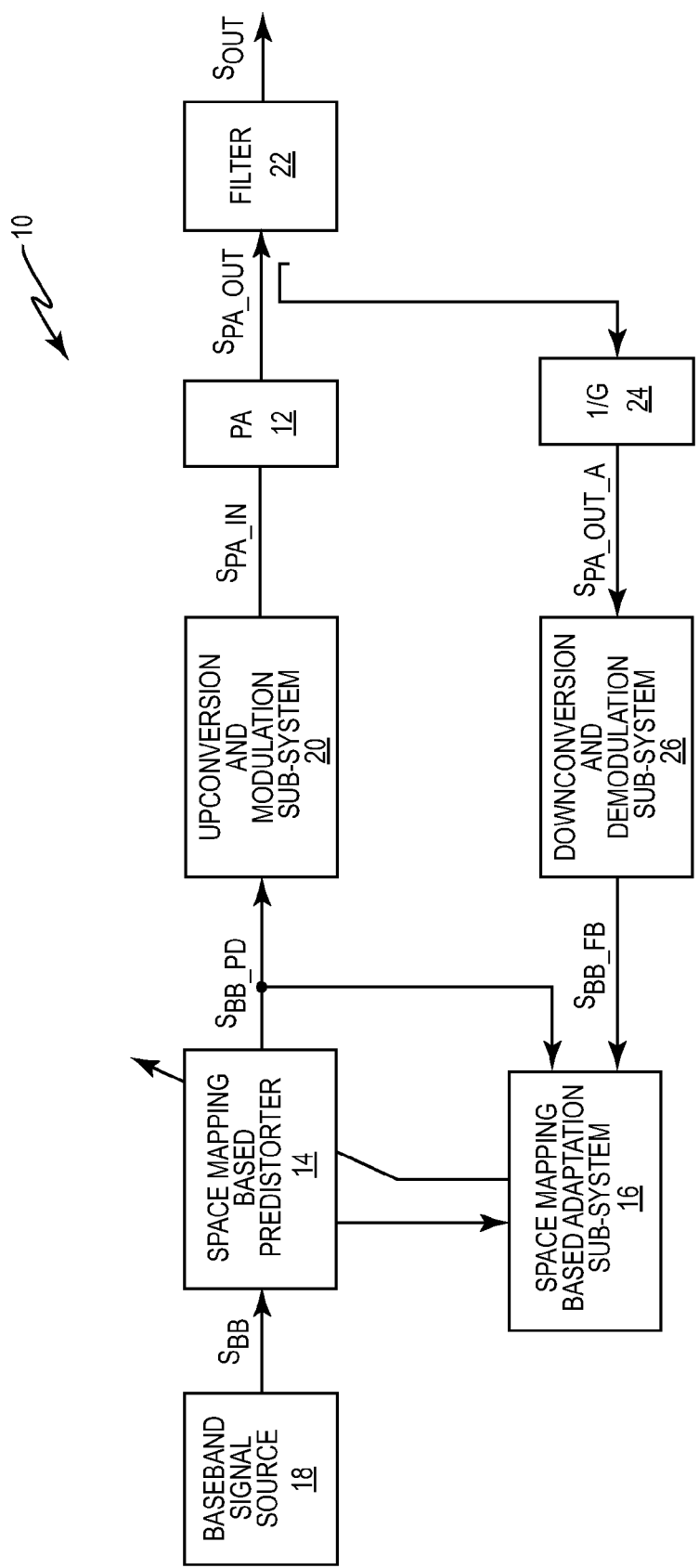
FIG. 1 illustrates a transmitter that compensates for power amplifier non-linearity using space mapping based predistortion according to one embodiment of the present disclosure.
Figure 2:
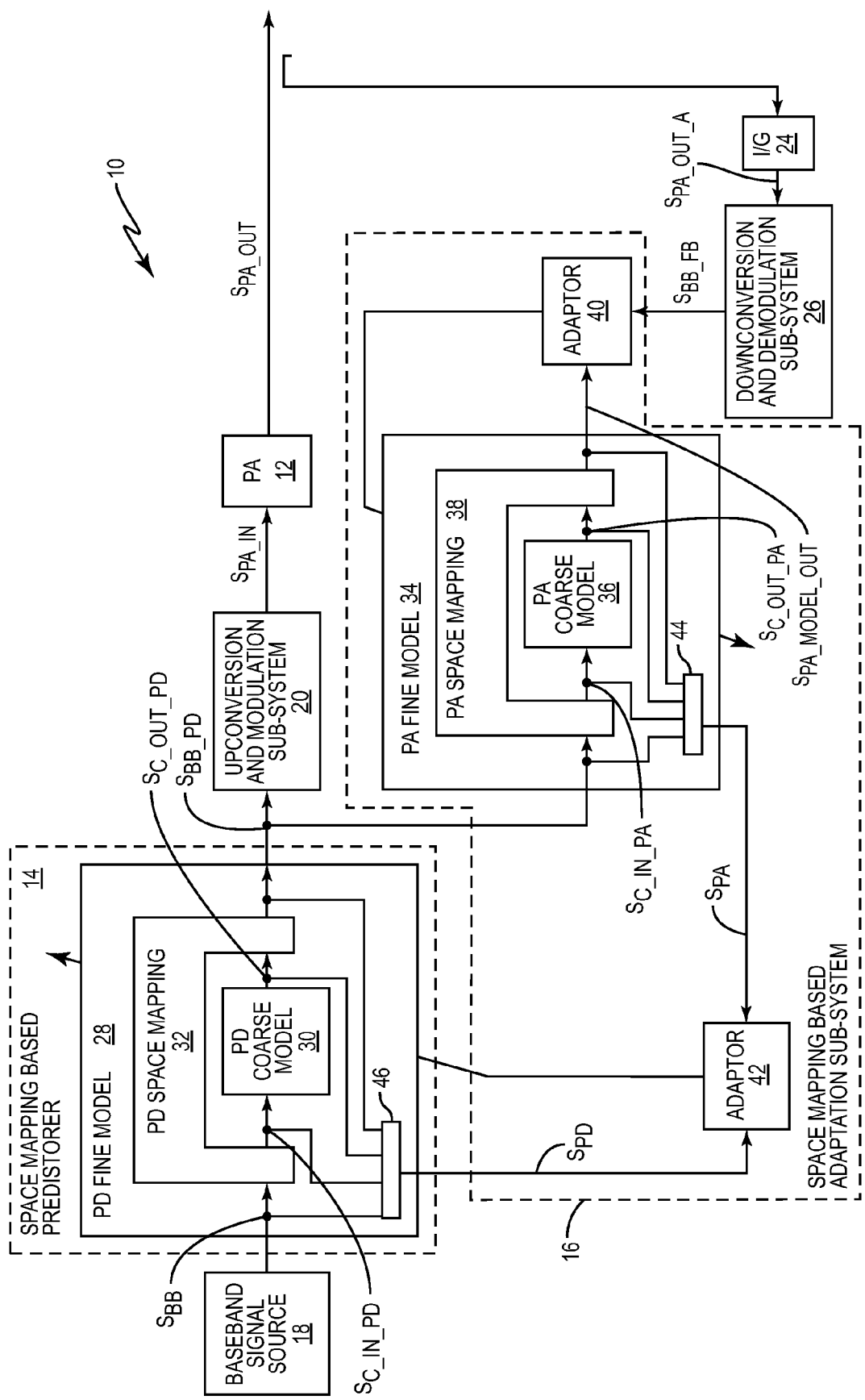
FIG. 2 illustrates the space mapping based predistorter and adaptation sub-system of FIG. 1 in more detail according to one embodiment of the present disclosure.
Figure 3:
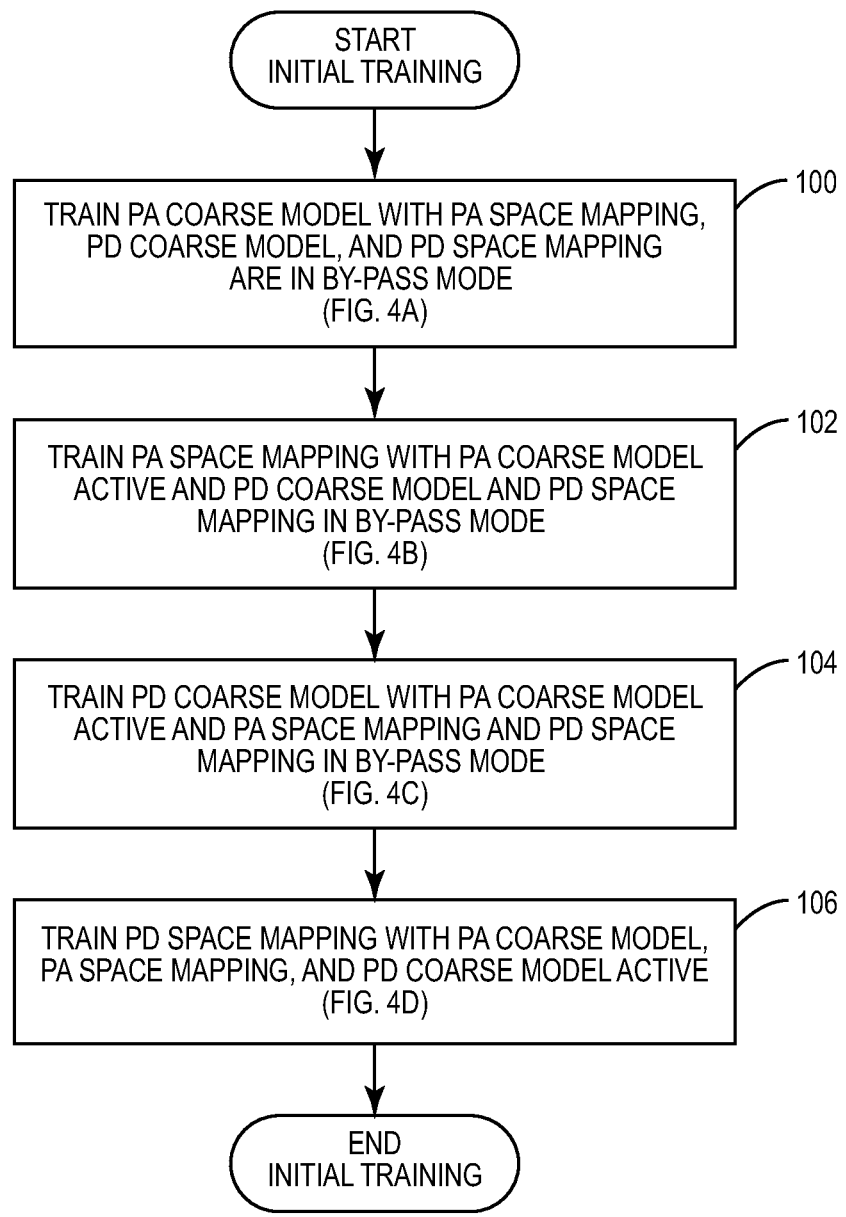
FIG. 3 is a flow chart illustrating an initial training process performed by the adaptation sub-system of FIGS. 1 and 2 according to one embodiment of the present disclosure.
Figure 5:
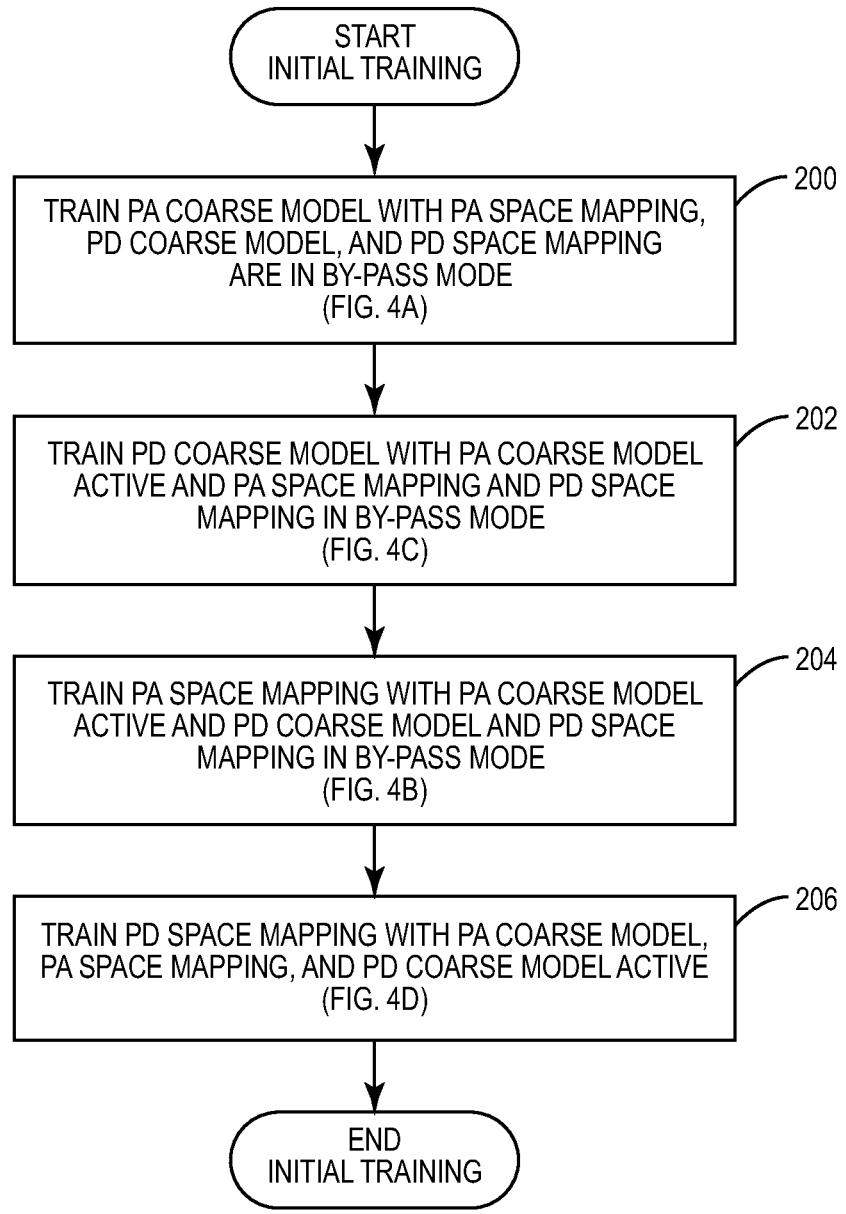
Figure 6:
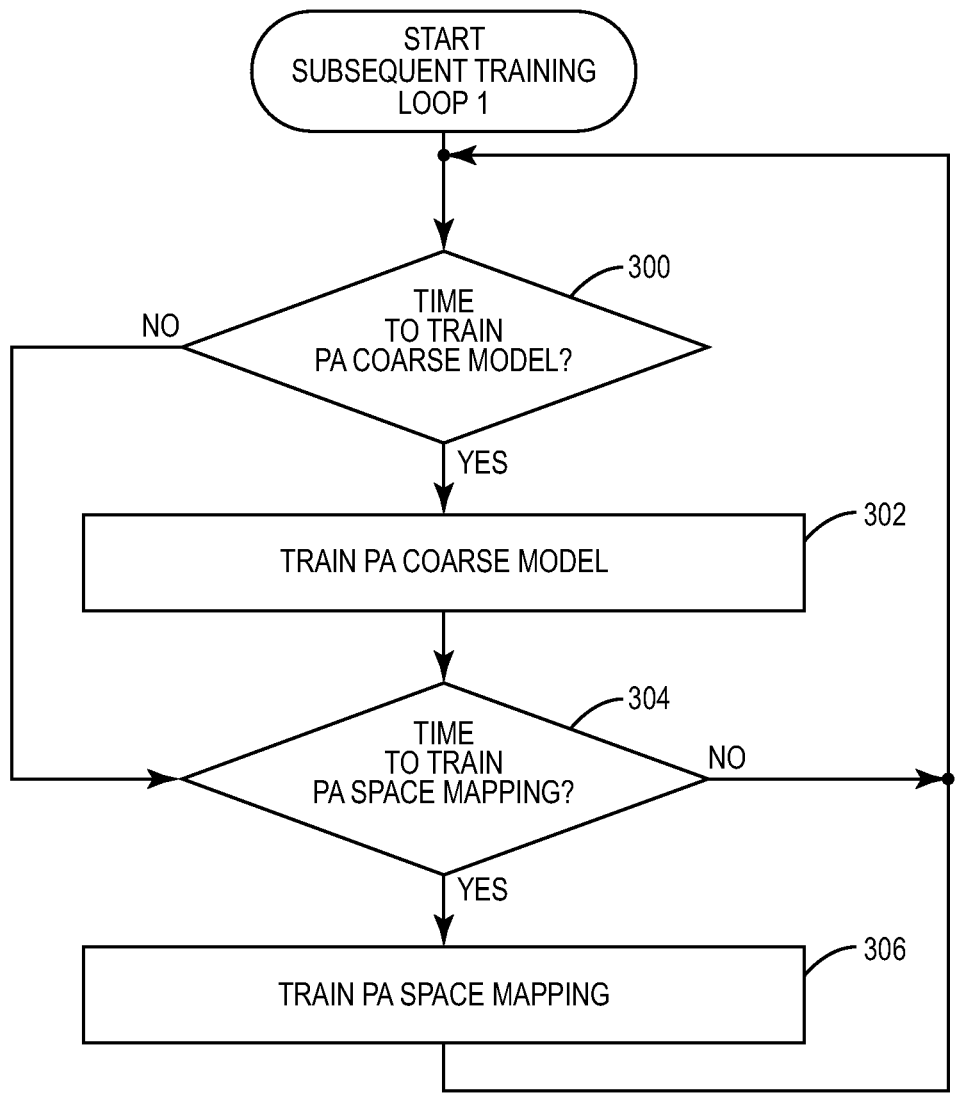
Figure 7:
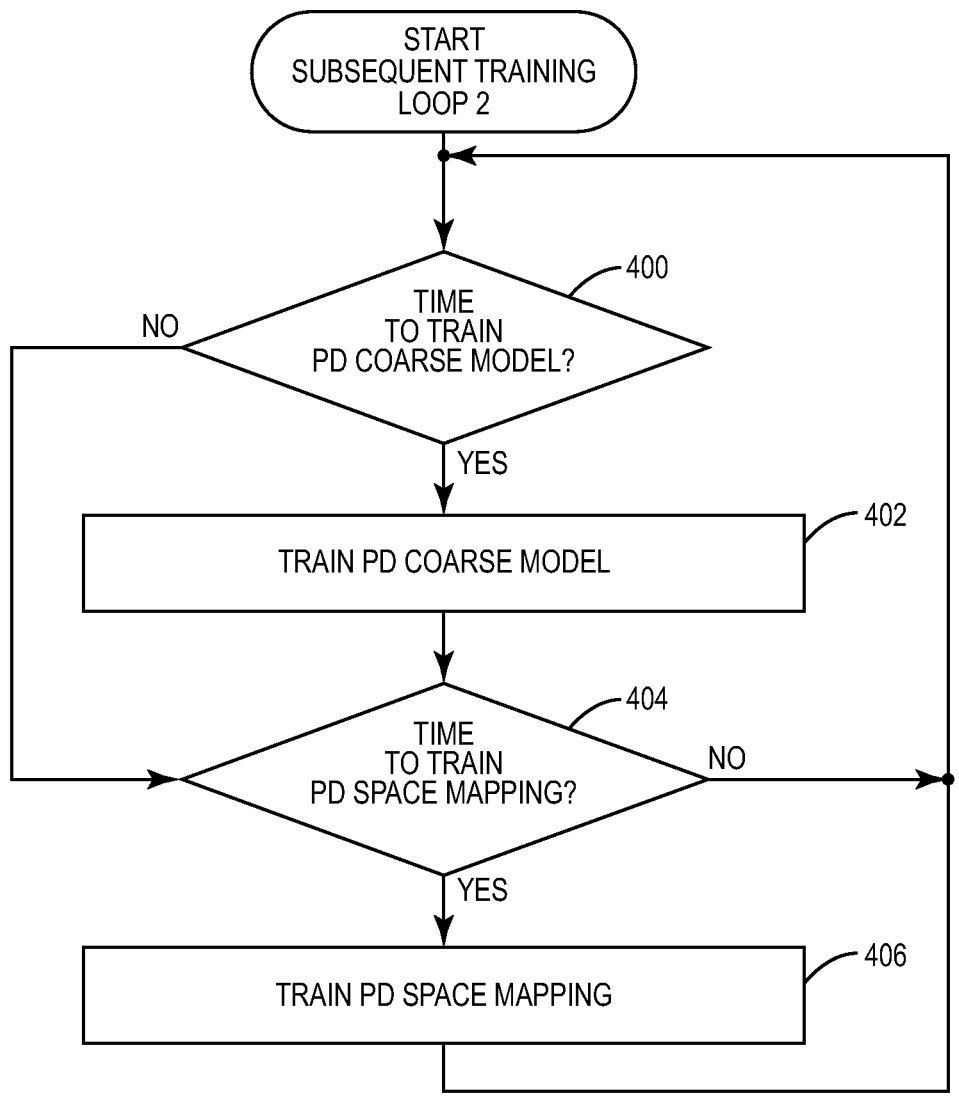

FIGS. 4A through 4D graphically illustrate the process of FIG. 3 according to one embodiment of the present disclosure;

FIG. 5 is a flow chart illustrating an initial training process performed by the space mapping based predistortion sub-system of FIGS. 1 and 2 according to another embodiment of the present disclosure; and FIGS. 6 and 7 are flow charts that illustrate training of the space mapping based predistorter subsequent to initial training according to one embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

FIG. 1 illustrates a transmitter 10 that compensates for power amplifier non-linearity using space mapping based predistortion according to one embodiment of the present disclosure. The transmitter 10 may be any type of transmitter. In one particular embodiment, the transmitter 10 is a wireless transmitter such as that used in a cellular communication network. In general, the transmitter 10 includes a power amplifier (PA) 12 that amplifies a power amplifier input signal ($S_{PA\_IN}$) to provide a power amplifier output signal ($S_{PA\_OUT}$) and a space mapping based predistorter 14 (hereinafter "predistorter 14") that effects predistortion of the power amplifier input signal ($S_{PA\_IN}$) to compensate for a non-linear characteristic of the power amplifier 12 using a space mapping based model of an inverse of the non-linear characteristic of the power amplifier 12. The transmitter 10 also includes a space mapping based adaptation sub-system 16 (hereinafter "adaptation sub-system 16") that adaptively configures the space mapping based model of the inverse of the non-linear characteristic of the power amplifier 12.

More specifically, as illustrated, the transmitter 10 includes a baseband signal source 18, the predistorter 14, an upconversion and modulation sub-system 20, the power amplifier 12, a filter 22, an attenuator 24, a downconversion and demodulation sub-system 26, and the adaptation sub-system 16 connected as shown. In operation, the baseband signal source 18 generates and outputs a baseband signal ($S_{BB}$). The predistorter 14 predistorts the baseband signal ($S_{BB}$) using a space mapping based model of an inverse of the non-linear characteristic of the power amplifier 12 to thereby provide a predistorted baseband signal ($S_{BB\_PD}$) that is predistorted in such a manner as to compensate for the non-linear characteristic of the power amplifier 12. The predistorted baseband signal ($S_{BB\_PD}$) is upconverted and modulated by the upconversion and modulation sub-system 20 to provide the power amplifier input signal ($S_{PA\_IN}$). The power amplifier 12 amplifies the power amplifier input signal ($S_{PA\_IN}$) to provide the power amplifier output signal ($S_{PA\_OUT}$). Notably, due to the predistortion, the power amplifier output signal ($S_{PA\_OUT}$) is as if the power amplifier 12 were a linear, or substantially linear, device. The power amplifier output signal ($S_{PA\_OUT}$) is filtered by the filter 22 to remove undesired frequency components to thereby provide an output signal ($S_{OUT}$) of the transmitter 10.

For the feedback path, the attenuator 24 attenuates the power amplifier output signal ($S_{PA\_OUT}$) by a factor 1/G, where G is a gain of the power amplifier 12, to thereby provide an attenuated power amplifier output signal ($S_{PA\_OUT\_A}$). The downconversion and demodulation sub-system 26 downconverts and demodulates the attenuated power amplifier output signal ($S_{PA\_OUT\_A}$) to provide a baseband feedback signal ($S_{BB\_FB}$). The adaptation sub-system 16 adaptively configures the predistorter 14 based on the baseband feedback signal ($S_{BB\_FB}$) and a time-aligned (e.g., delayed) version of the predistorted baseband signal ($S_{BB\_PD}$). The adaptation sub-system 16 adaptively configures the predistorter 14, and more specifically the space mapping based model of the inverse of the non-linear characteristic of the power amplifier 12, based on the space mapping based model of the non-linear characteristic of the power amplifier 12. By using the space mapping based models of the non-linear characteristic of the power amplifier 12 and the inverse of the non-linear characteristic of the power amplifier 12, a high fidelity model of the inverse of the non-linear characteristic of the power amplifier 12 is obtained without the computation complexity that would otherwise be required to obtain such a high fidelity model without the use of space mapping.

FIG. 2 illustrates the predistorter 14 and the adaptation sub-system 16 in more detail according to one embodiment of the present disclosure. As illustrated, the predistorter 14 includes a space mapping based fine model (i.e., a fine model that utilizes a space mapping technique) of the inverse of the non-linear characteristic of the power amplifier 12, which is referred to herein as a predistortion (PD) fine model 28. Notably, in this particular embodiment, the PD fine model 28 is more precisely a space mapping based model of a baseband equivalent of the inverse of the non-linear characteristic of the power amplifier 12. However, for ease of discussion, the PD fine model 28 is referred to herein as a space mapping based model of the inverse of the non-linear characteristic of the power amplifier 12. The PD fine model 28 includes a coarse model 30 of the inverse of the non-linear characteristic of the power amplifier 12 (hereinafter "PD coarse model 30"), and a space mapping 32 (hereinafter "PD space mapping 32") that maps the PD coarse model 30 to the PD fine model 28 using a space mapping technique.

In general, the PD coarse model 30 is a less precise or lower fidelity model of the inverse of the non-linear characteristic of the power amplifier 12 than the PD fine model 28. The PD coarse model 30 is generally any model of the inverse of the non-linear characteristic of the power amplifier 12 for which space mapping can be used to provide the PD fine model 28. For example, the PD coarse model 30 may be, for example, a model such as those used in conventional predistorters to compensate for power amplifier non-linearity such as, for example, a polynomial based model, a look-up-table (LUT) based model, or a neural network based model.

The PD space mapping 32 is implemented using any suitable technique that is suitable for mapping the PD coarse model 30 to the PD fine model 28. In one particular embodiment, the PD space mapping 32 is implemented using a neural network. Notably, as will be appreciated by one of ordinary skill in the art, space mapping is a term of art that refers to advanced modeling techniques that enable efficient, high fidelity modeling using a coarse, or approximate, surrogate model. A space mapping, P, is a mapping of parameters, $x_c$, for a coarse model (e.g., the PD coarse model 30) into parameters, $x_f$, for a fine model (e.g., the PD fine model 28) such that:

$$R_c(P(x_f)) \approx R_f(x_f),$$

where $R_c$ is a response vector of the coarse model and $R_f$ is a response vector of the fine model. While not essential or critical for understanding the concepts described herein, for a detailed discussion of some exemplary space mapping techniques, the interested reader is directed to J. W. Bandler, Q. S. Cheng, S. Dakroury, A. S. Mohamed, M. H. Bakr, K. Madsen, and J. Sondergaard, "Space mapping: The state of the art," IEEE Trans. Microw. Theory Tech., vol. 52, no. 1, pp. 337-361, January 2004 and Lei Zhang, Jianjun Xu, Mustapha C. E. Yagoub, Runtao Ding, and Qi-Jun Zhang, "Efficient Analytical Formulation and Sensitivity Analysis of Neuro-Space Mapping for Nonlinear Microwave Device Modeling," IEEE Trans. Microw. Theory Tech., vol. 53, no. 9, pp. 2752-2767, September 2005.

In operation, the PD fine model 28 receives the baseband signal ($S_{BB}$) from the baseband signal source 18. The PD space mapping 32 converts the baseband signal ($S_{BB}$) into a coarse model input signal ($S_{C\_IN\_PD}$). The PD coarse model 30 processes the coarse model input signal ($S_{C\_IN\_PD}$) to provide a coarse model output signal ($S_{C\_OUT\_PD}$). The PD space mapping 32 then converts the coarse model output signal ($S_{C\_OUT\_PD}$) into the predistorted baseband signal ($S_{BB\_PD}$), which is also an output signal of the PD fine model 28.

Similarly, the adaptation sub-system 16 includes a space mapping based fine model (i.e., a fine model that utilizes a space mapping technique) of the non-linear characteristic of the power amplifier 12, which is referred to herein as a PA fine model 34. Notably, in this particular embodiment, the PA fine model 34 is more precisely a space mapping based model of a baseband equivalent of the non-linear characteristic of the power amplifier 12. However, for ease of discussion, the PA fine model 34 is referred to herein as a space mapping based model of the inverse of the non-linear characteristic of the power amplifier 12. The PA fine model 34 includes a coarse model 36 (hereinafter "PA coarse model 36") of the non-linear characteristic of the power amplifier 12, and a space mapping 38 (hereinafter "PA space mapping 38") that maps the PA coarse model 36 to the PA fine model 34 using a space mapping technique.

In general, the PA coarse model 36 is a less precise or lower fidelity model of the non-linear characteristic of the power amplifier 12 than the PA fine model 34. The PA coarse model 36 is generally any model of the non-linear characteristic of the power amplifier 12 for which space mapping can be used to provide the PA fine model 34. For example, the PA coarse model 36 may be, for example, a polynomial based model, a LUT based model, or a neural network based model. Notably, the PA coarse model 36 is a counter-part of the PD coarse model 30 and preferably has the same structure as the PD coarse model 30. Also, the PA coarse model 36 preferably models short-term memory effects of the power amplifier 12.

The PA space mapping 38 is implemented using any suitable technique that is suitable for mapping the PA coarse model 36 to the PA fine model 34. In one particular embodiment, the PA space mapping 38 is implemented using a neural network. The PA space mapping 38 is a counter-part of the PD space mapping 32 and preferably has the same structure as the PD space mapping 32. Also, the PA space mapping 38 preferably models long-term memory effects of the power amplifier 12. In operation, the PA fine model 34 receives the predistorted baseband signal ($S_{BB\_PD}$), and the PA space mapping 38 converts the predistorted baseband signal ($S_{BB\_PD}$) into a coarse model input signal ($S_{C\_IN\_PA}$). The PA coarse model 36 processes the coarse model input signal ($S_{C\_IN\_PA}$) to provide a coarse model output signal ($S_{C\_OUT\_PA}$). The PA space mapping 38 then converts the coarse model output signal ($S_{C\_OUT\_PA}$) into a PA fine model output signal ($S_{PA\_MODEL\_OUT}$).

In addition, the adaptation sub-system 16 includes adaptors 40 and 42 that operate to adaptively configure the PA fine model 34 and the PD fine model 28, respectively, arranged as shown. More specifically, the adaptor 40 receives the baseband feedback signal ($S_{BB\_FB}$) and the PA fine model output signal ($S_{PA\_MODEL\_OUT}$). As discussed below in detail, the adaptor 40 configures the PA fine model 34, and more specifically the PA coarse model 36 and the PA space mapping 38, such that a difference between, or error between, the baseband feedback signal ($S_{BB\_FB}$) and the PA fine model output signal ($S_{PA\_MODEL\_OUT}$) is minimized (e.g., zero or substantially zero).

The adaptor 42 generally operates to configure the PD fine model 28 based on the PA fine model 34. More specifically, the adaptor 42 configures the PD fine model 28 based on a first adaptor input signal ($S_{PA}$) from the PA fine model 34 and a second adaptor input signal ($S_{PD}$) from the PD fine model 28. The first adaptor input signal ($S_{PA}$) is output by a multiplexor 44. The multiplexor 44 outputs either the predistorted baseband signal ($S_{BB\_PD}$), the coarse model input signal ($S_{C\_IN\_PA}$), the coarse model output signal ($S_{C\_OUT\_PA}$), or the PA fine model output signal ($S_{PA\_MODEL\_OUT}$). The multiplexor 44 is controlled by, for example, the adaptor 42 or a controller associated with the adaptation sub-system 16. The second adaptor input signal ($S_{PD}$) is either the baseband signal ($S_{BB}$), the coarse model input signal ($S_{SBB\_PD}$), the coarse model output signal ($S_{C\_OUT\_D}$), or the predistorted baseband signal ($S_{BB\_PD}$) output by a multiplexor 46. The multiplexor 46 is controlled by, for example, the adaptor 42 or a controller associated with the adaptation sub-system 16.

FIG. 3 is a flow chart illustrating an initial training process performed by the adaptation sub-system 16 of FIGS. 1 and 2 according to one embodiment of the present disclosure. The process of FIG. 3 is graphically illustrated in FIGS. 4A through 4D. While discussing the process of FIG. 3, references to FIGS. 4A through 4D will be made where applicable. First, the adaptation sub-system 16 trains the PA coarse model 36 with the PA space mapping 38 and the predistorter 14 in a by-pass mode or otherwise in an inactive state (step 100). The predistorter 14 is in the by-pass or inactive mode when the PD coarse model 30 and the PD space mapping 32 are in a by-pass or inactive mode.

Figure 4A:
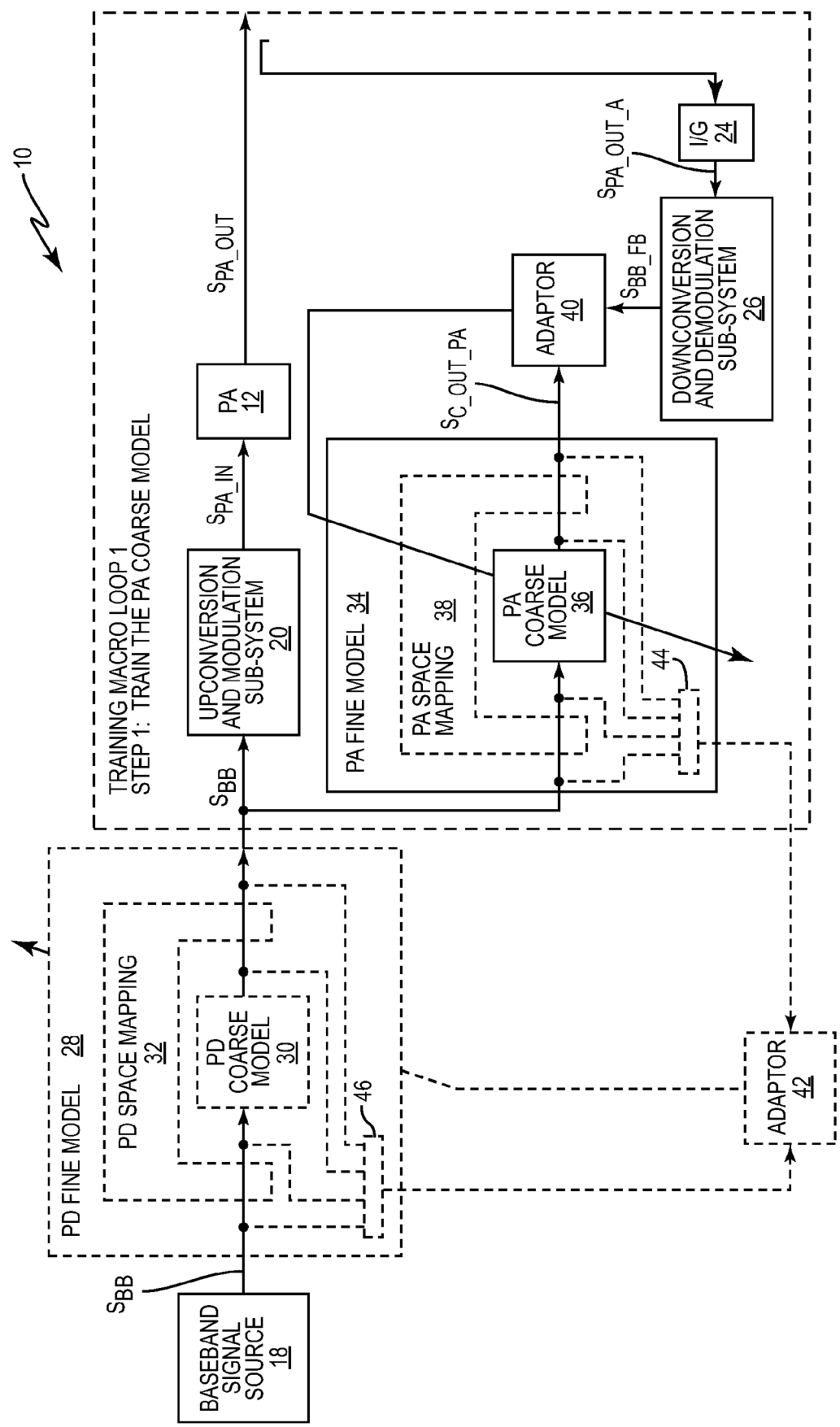

As illustrated in FIG. 4A, when training the PA coarse model 36, the predistorter 14 and the PA space mapping 38 are by-passed, or inactive, such that the baseband signal ($S_{BB}$) is input to the upconversion and modulation sub-system 20 and the PA coarse model 36. The upconversion and modulation sub-system 20 upconverts and modulates the baseband signal ($S_{BB}$) to provide the power amplifier input signal ($S_{PA\_IN}$), which is amplified by the power amplifier 12 to provide the power amplifier output signal ($S_{PA\_OUT}$). The power amplifier output signal ($S_{PA\_OUT}$) is attenuated by the attenuator 24, and the resulting attenuated power amplifier output signal ($S_{PA\_OUT\_A}$) is downconverted and demodulated by the downconversion and demodulation sub-system 26 to provide the baseband feedback signal ($S_{BB\_FB}$).

The PA coarse model 36 processes the baseband signal ($S_{BB}$) to provide the PA coarse model output signal ($S_{C\_OUT\_PA}$). Then, because the PA space mapping 38 is by-passed, the PA coarse model output signal ($S_{C\_OUT\_PA}$) is output to the adaptor 40. Using a conventional adaptive filtering technique, the adaptor 40 configures the PA coarse model 36 to minimize a difference, or error, between the PA coarse model output signal ($S_{C\_OUT\_PA}$) and the baseband feedback signal ($S_{BB\_FB}$). In this manner, the PA coarse model 36 is trained as a coarse model of the non-linearity of the power amplifier 12.

Figure 4B:
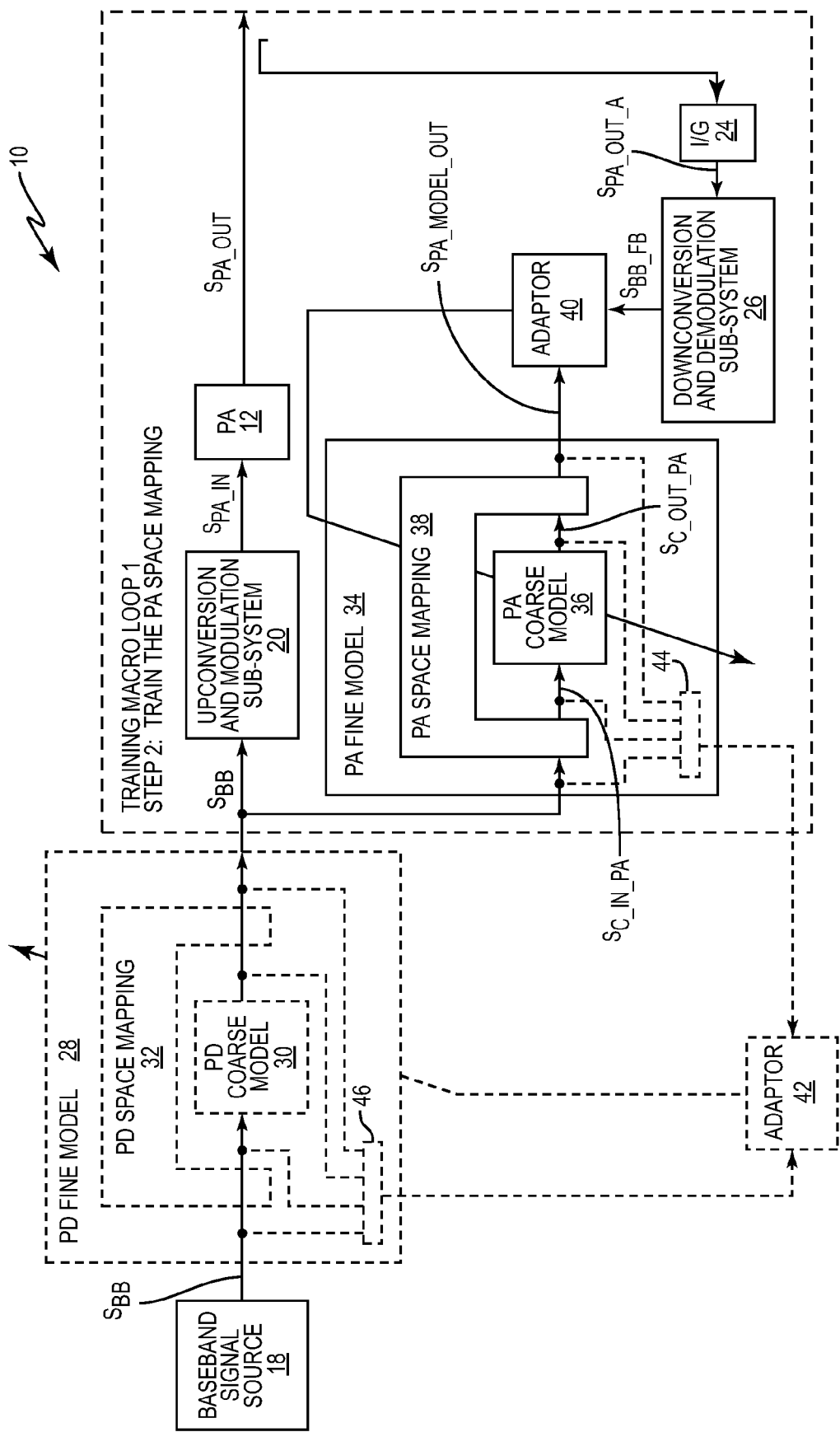

Second, after the PA coarse model 36 is trained, the adaptation sub-system 16 trains the PA space mapping 38 with the PA coarse model 36 active and the predistorter 14 in by-pass, or inactive, mode (step 102). As illustrated in FIG. 4B, when training the PA space mapping 38, the predistorter 14 is by-passed, or inactive, such that the baseband signal ($S_{BB}$) is input to the upconversion and modulation sub-system 20 and the PA fine model 34. The upconversion and modulation sub-system 20 upconverts and modulates the baseband signal ($S_{BB}$) to provide the power amplifier input signal ($S_{PA\_IN}$), which is amplified by the power amplifier 12 to provide the power amplifier output signal ($S_{PA\_OUT}$). The power amplifier output signal ($S_{PA\_OUT}$) is attenuated by the attenuator 24, and the resulting attenuated power amplifier output signal ($S_{PA\_OUT\_A}$) is downconverted and demodulated by the downconversion and demodulation sub-system 26 to provide the baseband feedback signal ($S_{BB\_FB}$).

In the PA fine model 34, the baseband signal ($S_{BB}$) is processed by the PA space mapping 38 and the PA coarse model 36 to provide the PA fine model output signal ($S_{PA\_MODEL\_OUT}$). Using a space mapping training technique, the adaptor 40 configures the PA space mapping 38 to minimize a difference, or error, between the PA fine model output signal ($S_{PA\_MODEL\_OUT}$) and the baseband feedback signal ($S_{BB\_FB}$). In this manner, the PA space mapping 38 is trained to map the PA coarse model 36 into a fine model of the non-linear characteristic of the power amplifier 12. The space mapping training technique may be, for example, the basic back propagation (BP) algorithm, or other first order gradient based algorithms or other standard optimization algorithms involving second order derivatives or their variations. While not essential for understanding the concepts disclosed here, for an exemplary space mapping training technique, the interested reader is directed to Rumelhart, D. E., Hinton, G. E., and Williams, R. J., *Learning representations by back-propagating errors*, Nature, 323, 533-536, October 1986.

Figure 4C:
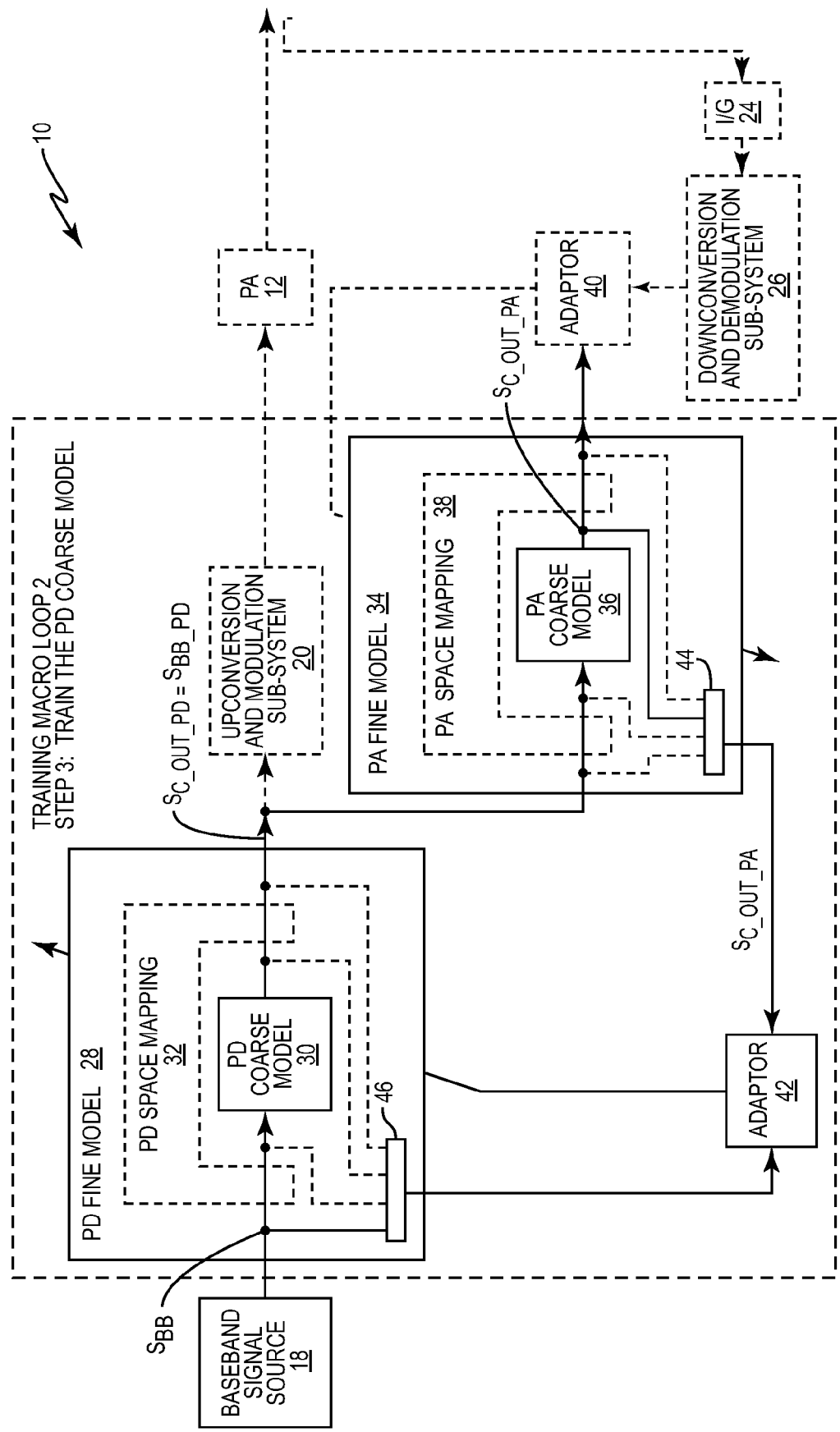

Third, after the PA space mapping 38 is trained, the adaptation sub-system 16 trains the PD coarse model 30 with the PA coarse model 36 active and the PA space mapping 38 and the PD space mapping 32 in by-pass, or inactive, mode (step 104). As illustrated in FIG. 4C, when training the PD coarse model 30, the PD space mapping 32 is by-passed such that the baseband signal ($S_{BB}$) is provided to the PD coarse model 30 and the output of the PD coarse model 30 is provided as the predistorted baseband signal ($S_{BB\_PD}$) (i.e., the output of the PD fine model 28). Notably, while training the PD coarse model 30, the upconversion and modulation sub-system 20 and the power amplifier 12 can be disabled.

In addition, when training the PD coarse model 30, the PA space mapping 38 is by-passed such that the predistorted baseband signal ($S_{BB\_PD}$) is input into the PA coarse model 36. The resulting PA coarse model output signal ($S_{C\_OUT\_PA}$) is then provided to the adaptor 42 via the multiplexor 44. Notably, while training the PD coarse model 30, the adaptor 40 is disabled such that the PA coarse model 36 remains constant while the PD coarse model 30 is trained. In addition, the attenuator 24 and the downconversion and demodulation sub-system 26 can be disabled. The adaptor 42 then trains the PD coarse model 30 to minimize a difference, or error, between the PA coarse model output signal ($S_{C\_OUT\_PA}$) and the baseband signal ($S_{BB}$), thereby training the PD coarse model 30 as the inverse of the PA coarse model 36.

Figure 4D:
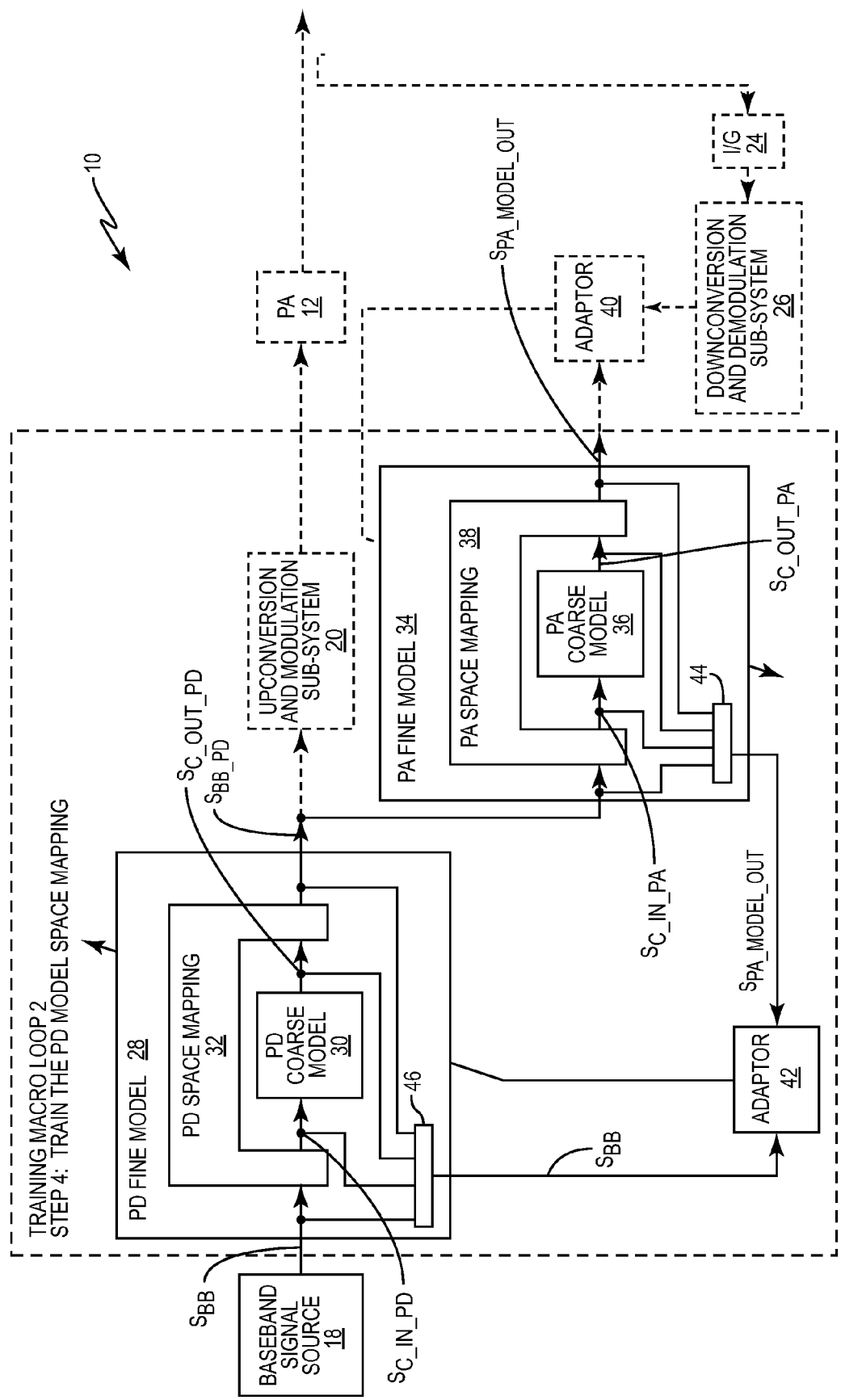

Lastly, after the PD coarse model 30 is trained, the adaptation sub-system 16 trains the PD space mapping 32 with the PA coarse model 36, the PA space mapping 38, and the PD coarse model 30 active (step 106). More specifically, as illustrated in FIG. 4D, the baseband signal ($S_{BB}$) is provided to the PD fine model 28 and processed by both the PD space mapping 32 and the PD coarse model 30 to provide the predistorted baseband signal ($S_{BB\_PD}$). Notably, while training the PD space mapping 32, the upconversion and modulation sub-system 20 and the power amplifier 12 can be disabled.

When training the PD space mapping 32, the predistorted baseband signal ($S_{BB\_PD}$) is input into the PA fine model 34 and processed by both the PA space mapping 38 and the PA coarse model 36 to provide the PA fine model output signal ($S_{PA\_MODEL\_OUT}$). The PA fine model output signal ($S_{PA\_MODEL\_OUT}$) is then provided to the adaptor 42 via the multiplexor 44. Notably, while training the PD space mapping 32, the adaptor 40 is disabled such that the PA fine model 34 remains constant while the PD space mapping 32 is trained. In addition, the attenuator 24 and the downconversion and demodulation sub-system 26 can be disabled. The adaptor 42 then trains the PD space mapping 32 using a space mapping technique to minimize a difference, or error, between the PA fine model output signal ($S_{PA\_MODEL\_OUT}$) and the baseband signal ($S_{BB}$), thereby training the PD fine model 28 as the inverse of the PA fine model 34. In this manner, the PD space mapping 32 is trained.

FIG. 5 is a flow chart illustrating an initial training process performed by the space mapping based predistortion sub-system of FIGS. 1 and 2 according to another embodiment of the present disclosure. This embodiment is substantially the same as that of FIG. 3 but with the ordering of steps 102 and 104 reversed. Since only the ordering of the steps has changed, the details of the individual steps are not repeated. First, the adaptation sub-system 16 trains the PA coarse model 36 with the PA space mapping 38 and the predistorter 14 in a by-pass mode or otherwise in an inactive state (step 200). Second, after the PA coarse model 36 is trained, the adaptation sub-system 16 trains the PD coarse model 30 with the PA coarse model 36 active and the PA space mapping 38 and the PD space mapping 32 in by-pass, or inactive, mode (step 202). Third, after the PD coarse model 30 is trained, the adaptation sub-system 16 trains the PA space mapping 38 with the PA coarse model 36 active and the predistorter 14 in by-pass, or inactive, mode (step 204). Lastly, after the PA space mapping 38 is trained, the adaptation sub-system 16 trains the PD space mapping 32 with the PA coarse model 36, the PA space mapping 38, and the PD coarse model 30 active (step 206).

FIGS. 6 and 7 are flow charts that illustrate training of the predistorter 14 subsequent to the initial training process of either FIG. 3 or FIG. 5 according to one embodiment of the present disclosure. It should be noted that FIGS. 6 and 7 are only examples. Numerous variations will be apparent to one of ordinary skill in the art upon reading this disclosure. More specifically, FIG. 6 illustrates a process for subsequent training of the PA fine model 34. First, the adaptor 40 determines whether it is time to train the PA coarse model 36 (step 300). In one particular embodiment, the PA coarse model 36 is trained at a predefined adaptation rate for the PA coarse model 36. If it is not yet time to train the PA coarse model 36, the process proceeds to step 304. Otherwise, the adaptor 40 trains the PA coarse model 36 in the manner described above (step 302). Note that unlike in the initial training, the predistorter 14 and the PA space mapping 38 may be active while performing subsequent training of the PA coarse model 36.

Next, the adaptor 40 determines whether it is time to train the PA space mapping 38 (step 304). In one particular embodiment, this subsequent training of the PA space mapping 38 is performed at a predefined adaptation rate for training the PA space mapping 38. While the adaptation rates for the PA coarse model 36 and the PA space mapping 38 may be different, in the preferred embodiment, the PA space mapping 38 is trained immediately following the training of the PA coarse model 36. If it is not time to train the PA space mapping 38, the process returns to step 300. Otherwise, the adaptor 40 trains the PA space mapping 38 in the manner described above (step 306). Note that unlike in the initial training, the predistorter 14 may be active while performing subsequent training of the PA space mapping 38. Before proceeding, it should be noted that, if the predistorter 14 is active during training of the PA coarse model 36 and the PA space mapping 38 in steps 302 and 306, the adaptor 42 is disabled or is otherwise configured such that the PD fine model 28 remains constant while training the PA coarse model 36 and the PA space mapping 38.

FIG. 7 illustrates a process for subsequent training of the PA fine model 34. First, the adaptor 42 determines whether it is time to train the PD coarse model 30 (step 400). In one particular embodiment, the PD coarse model 30 is trained at a predefined adaptation rate for the PD coarse model 30. If it is not yet time to train the PD coarse model 30, the process proceeds to step 404. Otherwise, the adaptor 42 trains the PD coarse model 30 in the manner described above (step 402). Note that unlike in the initial training, the PD space mapping 32, the PA coarse model 36, and the PA space mapping 38 may be active while performing subsequent training of the PD coarse model 30.

Next, the adaptor 42 determines whether it is time to train the PD space mapping 32 (step 404). In one particular embodiment, this subsequent training of the PD space mapping 32 is performed at a predefined adaptation rate for training the PD space mapping 32. While the adaptation rates for the PD coarse model 30 and the PD space mapping 32 may be different, in the preferred embodiment, the PD space mapping 32 is trained immediately following the training of the PD coarse model 30. If it is not time to train the PD space mapping 32, the process returns to step 400. Otherwise, the adaptor 42 trains the PD space mapping 32 in the manner described above (step 406). Before proceeding, it should be noted that the adaptor 40 is disabled or is otherwise configured such that the PA fine model 34 remains constant while training the PD coarse model 30 and the PD space mapping 32.

The following acronyms are used throughout this disclosure.

3GPP Third Generation Partnership Project
BP Back Propagation
LUT Look-Up-Table
PA Power Amplifier
PD Predistortion Those skilled in the art will recognize improvements and modifications to the preferred embodiments of the present disclosure. All such improvements and modifications are considered within the scope of the concepts disclosed herein and the claims that follow.

What is claimed is:

1. A transmitter comprising: a power amplifier configured to amplify a power amplifier input signal to provide a power amplifier output signal; and a predistorter configured to effect predistortion of the power amplifier input signal to compensate for a non-linear characteristic of the power amplifier using a space mapping based model of an inverse of the non-linear characteristic of the power amplifier, wherein the space mapping based model maps a coarse model of the inverse of the non-linear characteristic of the power amplifier into a fine model of the inverse of the non-linear characteristic of the power amplifier utilizing a space mapping technique.

2. The transmitter of claim 1 further comprising an adaptation sub-system configured to adaptively configure the space mapping based model of the inverse of the non-linear characteristic of the power amplifier.

3. The transmitter of claim 1 wherein the space mapping based model of the inverse of the non-linear characteristic of the power amplifier comprises the coarse model of the inverse of the non-linear characteristic of the power amplifier and a space mapping for the coarse model of the inverse of the non-linear characteristic of the power amplifier that maps the coarse model of the inverse of the non-linear characteristic of the power amplifier into the space mapping based model of the inverse of the non-linear characteristic of the power amplifier, where the space mapping based model of the inverse of the non-linear characteristic of the power amplifier is the fine model of the inverse of the non-linear characteristic of the power amplifier.

4. The transmitter of claim 3 further comprising an adaptation sub-system configured to adaptively configure the space mapping based model of the inverse of the non-linear characteristic of the power amplifier using a space mapping based model of the non-linear characteristic of the power amplifier.

5. The transmitter of claim 4 wherein the space mapping based model of the non-linear characteristic of the power amplifier comprises a coarse model of the non-linear characteristic of the power amplifier and a space mapping for the coarse model of the non-linear characteristic of the power amplifier that maps the coarse model of the non-linear characteristic of the power amplifier into the space mapping based model of the non-linear characteristic of the power amplifier, where the space mapping based model of the non-linear characteristic of the power amplifier is a fine model of the non-linear characteristic of the power amplifier.

6. The transmitter of claim 5 wherein, in order to perform an initial training for the predistorter, the adaptation sub-system is further configured to, in the following order:
  train the coarse model of the non-linear characteristic of the power amplifier with the space mapping for the coarse model of the non-linear characteristic of the power amplifier and the predistorter inactive;
  train the space mapping for the coarse model of the non-linear characteristic of the power amplifier with the coarse model of the non-linear characteristic of the power amplifier active and the predistorter inactive;
  train the coarse model of the inverse of the non-linear characteristic of the power amplifier with the coarse model of the non-linear characteristic of the power amplifier active and the space mapping for the coarse model of the non-linear characteristic of the power amplifier and the space mapping for the coarse model of the inverse of the non-linear characteristic of the power amplifier inactive; and
  train the space mapping for the coarse model of the inverse of the non-linear characteristic of the power amplifier with the coarse model of the inverse of the non-linear characteristic of the power amplifier, the coarse model of the non-linear characteristic of the power amplifier, and the space mapping for the coarse model of the non-linear characteristic of the power amplifier active.

7. The transmitter of claim 6 wherein, subsequent to the initial training for the predistorter, the adaptation sub-system is further configured to, while the coarse model of the inverse of the non-linear characteristic of the power amplifier and the space mapping for the coarse model of the inverse of the non-linear characteristic of the power amplifier are constant:
  update the coarse model of the non-linear characteristic of the power amplifier; and
  update the space mapping for the coarse model of the non-linear characteristic of the power amplifier after updating the coarse model of the non-linear characteristic of the power amplifier.

8. The transmitter of claim 6 wherein, subsequent to the initial training for the predistorter, the adaptation sub-system is further configured to, while the coarse model of the non-linear characteristic of the power amplifier and the space mapping for the coarse model of the non-linear characteristic of the power amplifier are constant:
  update the coarse model of the inverse of the non-linear characteristic of the power amplifier; and
  update the space mapping for the coarse model of the inverse of the non-linear characteristic of the power amplifier after updating the coarse model of the inverse of the non-linear characteristic of the power amplifier.

9. The transmitter of claim 5 wherein, in order to perform an initial training for the predistorter, the adaptation sub-system is further configured to, in the following order:
  train the coarse model of the non-linear characteristic of the power amplifier with the space mapping for the coarse model of the non-linear characteristic of the power amplifier and the predistorter inactive;
  train the coarse model of the inverse of the non-linear characteristic of the power amplifier with the coarse model of the non-linear characteristic of the power amplifier active and the space mapping for the coarse model of the non-linear characteristic of the power amplifier and the space mapping for the coarse model of the inverse of the non-linear characteristic of the power amplifier inactive;
  train the space mapping for the coarse model of the non-linear characteristic of the power amplifier with the coarse model of the non-linear characteristic of the power amplifier active and the predistorter inactive; and
  train the space mapping for the coarse model of the inverse of the non-linear characteristic of the power amplifier with the coarse model of the inverse of the non-linear characteristic of the power amplifier, the coarse model of the non-linear characteristic of the power amplifier, and the space mapping for the coarse model of the non-linear characteristic of the power amplifier active.

10. The transmitter of claim 9 wherein, subsequent to the initial training for the predistorter, the adaptation sub-system is further configured to, while the coarse model of the inverse of the non-linear characteristic of the power amplifier and the space mapping for the coarse model of the inverse of the non-linear characteristic of the power amplifier are constant:
  update the coarse model of the non-linear characteristic of the power amplifier; and
  update the space mapping for the coarse model of the non-linear characteristic of the power amplifier after updating the coarse model of the non-linear characteristic of the power amplifier.

11. The transmitter of claim 9 wherein, subsequent to the initial training for the predistorter, the adaptation sub-system is further configured to, while the coarse model of the non-linear characteristic of the power amplifier and the space mapping for the coarse model of the non-linear characteristic of the power amplifier are constant:
  update the coarse model of the inverse of the non-linear characteristic of the power amplifier; and
  update the space mapping for the coarse model of the inverse of the non-linear characteristic of the power amplifier after updating the coarse model of the inverse of the non-linear characteristic of the power amplifier.

12. A method comprising: amplifying, via a power amplifier, a power amplifier input signal to provide a power amplifier output signal; and effecting predistortion of the power amplifier input signal to compensate for a non-linear characteristic of the power amplifier using a space mapping based model of an inverse of the non-linear characteristic of the power amplifier, wherein the space mapping based model maps a coarse model of the inverse of the non-linear characteristic of the power amplifier into a fine model of the inverse of the non-linear characteristic of the power amplifier utilizing a space mapping technique.

13. The method of claim 12 further comprising adaptively configuring the space mapping based model of the inverse of the non-linear characteristic of the power amplifier.

14. The method of claim 12 wherein the space mapping based model of the inverse of the non-linear characteristic of the power amplifier comprises the coarse model of the inverse of the non-linear characteristic of the power amplifier and a space mapping for the coarse model of the inverse of the non-linear characteristic of the power amplifier that maps the coarse model of the inverse of the non-linear characteristic of the power amplifier into the space mapping based model of the inverse of the non-linear characteristic of the power amplifier, where the space mapping based model of the inverse of the non-linear characteristic of the power amplifier is the fine model of the inverse of the non-linear characteristic of the power amplifier.

15. The method of claim 14 further comprising adaptively configuring the space mapping based model of the inverse of the non-linear characteristic of the power amplifier using a space mapping based model of the non-linear characteristic of the power amplifier.

16. The method of claim 15 wherein the space mapping based model of the non-linear characteristic of the power amplifier comprises a coarse model of the non-linear characteristic of the power amplifier and a space mapping for the coarse model of the non-linear characteristic of the power amplifier that maps the coarse model of the non-linear characteristic of the power amplifier into the space mapping based model of the non-linear characteristic of the power amplifier, where the space mapping based model of the non-linear characteristic of the power amplifier is a fine model of the non-linear characteristic of the power amplifier.

17. The method of claim 16 wherein prior to amplifying the power amplifier input signal and effecting predistortion of the power amplifier input signal, the method further comprises performing an initial training process, wherein performing the initial training process comprises, in the following order:
    training the coarse model of the non-linear characteristic of the power amplifier with the space mapping for the coarse model of the non-linear characteristic of the power amplifier, the coarse model of the inverse of the non-linear characteristic of the power amplifier, and the space mapping for the coarse model of the inverse of the non-linear characteristic of the power amplifier inactive;
    training the space mapping for the coarse model of the non-linear characteristic of the power amplifier with the coarse model of the non-linear characteristic of the power amplifier active and the coarse model of the inverse of the non-linear characteristic of the power amplifier and the space mapping for the coarse model of the inverse of the non-linear characteristic of the power amplifier inactive;
    training the coarse model of the inverse of the non-linear characteristic of the power amplifier with the coarse model of the non-linear characteristic of the power amplifier active and the space mapping for the coarse model of the non-linear characteristic of the power amplifier and the space mapping for the coarse model of the inverse of the non-linear characteristic of the power amplifier inactive; and
    training the space mapping for the coarse model of the inverse of the non-linear characteristic of the power amplifier with the coarse model of the inverse of the non-linear characteristic of the power amplifier, the coarse model of the non-linear characteristic of the power amplifier, and the space mapping for the coarse model of the non-linear characteristic of the power amplifier active.

18. The method of claim 17 wherein, subsequent to performing the initial training process, the method further comprises, while the coarse model of the inverse of the non-linear characteristic of the power amplifier and the space mapping for the coarse model of the inverse of the non-linear characteristic of the power amplifier are constant:
    updating the coarse model of the non-linear characteristic of the power amplifier; and
    updating the space mapping for the coarse model of the non-linear characteristic of the power amplifier after updating the coarse model of the non-linear characteristic of the power amplifier.

19. The method of claim 17 wherein, subsequent to performing the initial training process, the method further comprises, while the coarse model of the non-linear characteristic of the power amplifier and the space mapping for the coarse model of the non-linear characteristic of the power amplifier are constant:
    updating the coarse model of the inverse of the non-linear characteristic of the power amplifier; and
    updating the space mapping for the coarse model of the inverse of the non-linear characteristic of the power amplifier after updating the coarse model of the inverse of the non-linear characteristic of the power amplifier.

20. The method of claim 16 wherein prior to amplifying the power amplifier input signal and effecting predistortion of the power amplifier input signal, the method further comprises performing an initial training process, wherein performing the initial training process comprises, in the following order:
    training the coarse model of the non-linear characteristic of the power amplifier with the space mapping for the coarse model of the non-linear characteristic of the power amplifier, the coarse model of the inverse of the non-linear characteristic of the power amplifier, and the space mapping for the coarse model of the inverse of the non-linear characteristic of the power amplifier inactive;
    training the coarse model of the inverse of the non-linear characteristic of the power amplifier with the coarse model of the non-linear characteristic of the power amplifier active and the space mapping for the coarse model of the non-linear characteristic of the power amplifier and the space mapping for the coarse model of the inverse of the non-linear characteristic of the power amplifier inactive;
    training the space mapping for the coarse model of the non-linear characteristic of the power amplifier with the coarse model of the non-linear characteristic of the power amplifier active and the coarse model of the inverse of the non-linear characteristic of the power amplifier and the space mapping for the coarse model of the inverse of the non-linear characteristic of the power amplifier inactive; and
    training the space mapping for the coarse model of the inverse of the non-linear characteristic of the power amplifier with the coarse model of the inverse of the non-linear characteristic of the power amplifier, the coarse model of the non-linear characteristic of the power amplifier, and the space mapping for the coarse model of the non-linear characteristic of the power amplifier active.

21. The method of claim 20 wherein, subsequent to performing the initial training process, the method further comprises, while the coarse model of the inverse of the non-linear characteristic of the power amplifier and the space mapping for the coarse model of the inverse of the non-linear characteristic of the power amplifier are constant:
- updating the coarse model of the non-linear characteristic of the power amplifier; and
- updating the space mapping for the coarse model of the non-linear characteristic of the power amplifier after updating the coarse model of the non-linear characteristic of the power amplifier.

22. The method of claim 20 wherein, subsequent to performing the initial training process, the method further comprises, while the coarse model of the non-linear characteristic of the power amplifier and the space mapping for the coarse model of the non-linear characteristic of the power amplifier are constant:
- updating the coarse model of the inverse of the non-linear characteristic of the power amplifier; and
- updating the space mapping for the coarse model of the inverse of the non-linear characteristic of the power amplifier after updating the coarse model of the inverse of the non-linear characteristic of the power amplifier.

* * * * *

UNITED STATES PATENT AND TRADEMARK OFFICE
CERTIFICATE OF CORRECTION

PATENT NO. : 8,811,532 B2
APPLICATION NO. : 13/443949
DATED : August 19, 2014
INVENTOR(S) : Bai It is certified that error appears in the above-identified patent and that said Letters Patent is hereby corrected as shown below:

In the specification

In Column 3, Lines 35-36, delete "DRAWING FIGURES" and insert -- DRAWING/FIGURES --, therefor.

In Column 7, Line 10, delete "($S_{SBB\ PD}$)," and insert -- ($S_{C\ IN\ PD}$), --, therefor.

In Column 7, Line 11, delete "($S_{C\_OUT\_D}$)," and insert -- ($S_{C\_OUT\_PD}$), --, therefor.

Signed and Sealed this
Twenty-eighth Day of June, 2016

Michelle K. Lee
*Director of the United States Patent and Trademark Office*